United States Patent
Kumar et al.

(10) Patent No.: US 10,242,133 B2
(45) Date of Patent: Mar. 26, 2019

(54) ESTIMATING FROST MASS FORMED IN A DESIGN COMPONENT OF A MULTI-COMPONENT STRUCTURE

(71) Applicant: AIRBUS GROUP INDIA PRIVATE LIMITED, Bangalore (IN)

(72) Inventors: Sunil Kumar, Bangalore (IN); Madhusudhana Reddy, Bangalore (IN)

(73) Assignee: AIRBUS GROUP INDIA PRIVATE LIMITED, Bangalore, Karnataka (IN)

( * ) Notice: Subject to any disclaimer, the term of this patent is extended or adjusted under 35 U.S.C. 154(b) by 370 days.

(21) Appl. No.: 15/089,478

(22) Filed: Apr. 2, 2016

(65) Prior Publication Data

US 2016/0292328 A1    Oct. 6, 2016

(30) Foreign Application Priority Data

Apr. 3, 2015 (IN) .......................... 1784/CHE/2015

(51) Int. Cl.
G06F 17/10 (2006.01)
G06F 17/50 (2006.01)
G06F 17/11 (2006.01)

(52) U.S. Cl.
CPC .......... *G06F 17/5009* (2013.01); *G06F 17/11* (2013.01); *G06F 17/5095* (2013.01)

(58) Field of Classification Search
None
See application file for complete search history.

(56) References Cited

U.S. PATENT DOCUMENTS 9,546,004 B1 *  1/2017  Safai .................. B64D 45/00

OTHER PUBLICATIONS

Luer et al. Frost Deposition in a Parallel Plate Channel Under Laminar Flow Conditions Int. J. Therm. Sci., 2000 39 pp. 85-95.*
Ellgas et al. Modeling Frost Formation Within a Commercial 3-D CFD Code Numerical Heat Transfer, Part A, 53 2008 pp. 485-506.*
Huang et al. The Effects of Frost Thickness on the Heat Transfer of Finned Tube Heat EXchanger Subject to the Combined Influence of Gan Types Applied Thermal Engineering 28, 2008 pp. 728-737.*
Gall et al. Modeling of Frost Growth and Densification Int. . Heat Mass Transfer, vol. 40, No. 13, pp. 3177-3187, 1997.*
Silva et al. Experimental Study of Frost Accumulation on Fan-Supplied Tube-Fin Evaporators Applied Thermal Engineering 31, pp. 1013-1020 (Year: 2011).*

* cited by examiner

*Primary Examiner* — Aniss Chad
*Assistant Examiner* — Cuong V Luu
(74) *Attorney, Agent, or Firm* — Prakash Nama; Global IP Services, PLLC (57) ABSTRACT

A system and method for estimating frost mass formed in a design component of a multi-component structure are disclosed. In one embodiment, the frost mass formed in the design component is iteratively estimated using a porosity parameter associated with a fluid medium, a height of a frost layer and/or a density of the frost layer in the design component.

16 Claims, 6 Drawing Sheets

FIG. 5

ESTIMATING FROST MASS FORMED IN A DESIGN COMPONENT OF A MULTI-COMPONENT STRUCTURE

RELATED APPLICATIONS

Benefit is claimed under 35 U.S.C. 119(a)-(d) to Foreign application Serial No. 1784/CHE/2015 filed in India entitled "ESTIMATING FROST MASS FORMED IN A DESIGN COMPONENT OF A MULTI-COMPONENT STRUCTURE", on Apr. 3, 2015, by AIRBUS GROUP INDIA PRIVATE LIMITED, which is herein incorporated in its entirety by reference for all purposes.

TECHNICAL FIELD

Embodiments of the present subject matter generally relate to frost formed in a design component of a multi-component structure, and more particularly, to estimating frost mass formed in the design component of the multi-component structure.

BACKGROUND

Typically, during operation a design component of a multi-component structure encounter humid air and the humid air may condense due to surrounding low temperatures. This can result in forming frost in and around the design component and reducing efficiency of the design component. Example multi-component structure is a vehicle, an air conditioning system and so on. Exemplary vehicle is an aircraft, an automobile and the like. The design component may be a duct or a bend having uniform or non-uniform cross sections. Generally, ambient air may come and go out of an aircraft cabin based on ventilation systems and passenger comfort needs. When humid ambient air gets stagnated in insulation near an aircraft door, humidity in the air may condense on cold walls of design components in the aircraft door, forming frost in and around the design components. The accumulated frost can decrease the performance and also substantially increase the weight of the aircraft which may result in increasing fuel consumption.

SUMMARY

A technique for estimating frost mass formed in a design component of a multi-component structure is disclosed. According to one aspect of the present subject matter, the frost mass formed in the design component may be iteratively estimated using a porosity parameter associated with a fluid medium, a height of a frost layer and/or a density of the frost layer in the design component.

According to another aspect of the present subject matter, the system includes a processor and a memory coupled to the processor. The memory includes a frost modeling tool. In one embodiment, the frost modeling tool iteratively estimates frost mass formed in a design component of a multi-component structure using a porosity parameter associated with a fluid medium, a height of a frost layer and/or a density of the frost layer in the design component.

According to yet another aspect of the present subject matter, a non-transitory computer-readable storage medium of estimating frost mass formed in a design component of a multi-component structure, having instructions that, when executed by a computing device causes the computing device to perform the method described above.

The system and method disclosed herein may be implemented in any means for achieving various aspects. Other features will be apparent from the accompanying drawings and from the detailed description that follow.

BRIEF DESCRIPTION OF THE DRAWINGS

Various embodiments are described herein with reference to the drawings, wherein.

The drawings described herein are for illustration purposes only and are not intended to limit the scope of the present disclosure in any way.

DETAILED DESCRIPTION

In the following detailed description of the embodiments of the present subject matter, references are made to the accompanying drawings that form a part hereof, and in which are shown by way of illustration specific embodiments in which the present subject matter may be practiced. These embodiments are described in sufficient detail to enable those skilled in the art to practice the present subject matter, and it is to be understood that other embodiments may be utilized and that changes may be made without departing from the scope of the present subject matter. The following detailed description is, therefore, not to be taken in a limiting sense, and the scope of the present subject matter is defined by the appended claims.

Embodiments described herein provide methods, techniques, and systems for estimating frost mass formed in a design component of a multi-component structure. For example, the multi-component structure includes a vehicle (e.g., an aircraft, an automobile and the like), an air conditioning system and so on. The design component may include ducts or bends having uniform or non-uniform cross-sectional areas. In an embodiment, the fluid medium in the design component is modeled as a porous medium and a porosity parameter (i.e., a porosity value) is updated as per growth of a frost layer. Further, a heat transfer rate at an interface between the fluid medium and the frost layer in the design component is computed based on the porosity parameter inside the porous medium (representing the frost layer). Also, a height and density of the frost layer is determined based on a condensation rate which is determined by the heat transfer rate at the interface. Frost mass is then estimated based on the determined height and density of the frost layer.

Thus, the frost mass is reliably estimated as the frost layer is modeled inside the fluid medium.

Figure 1:
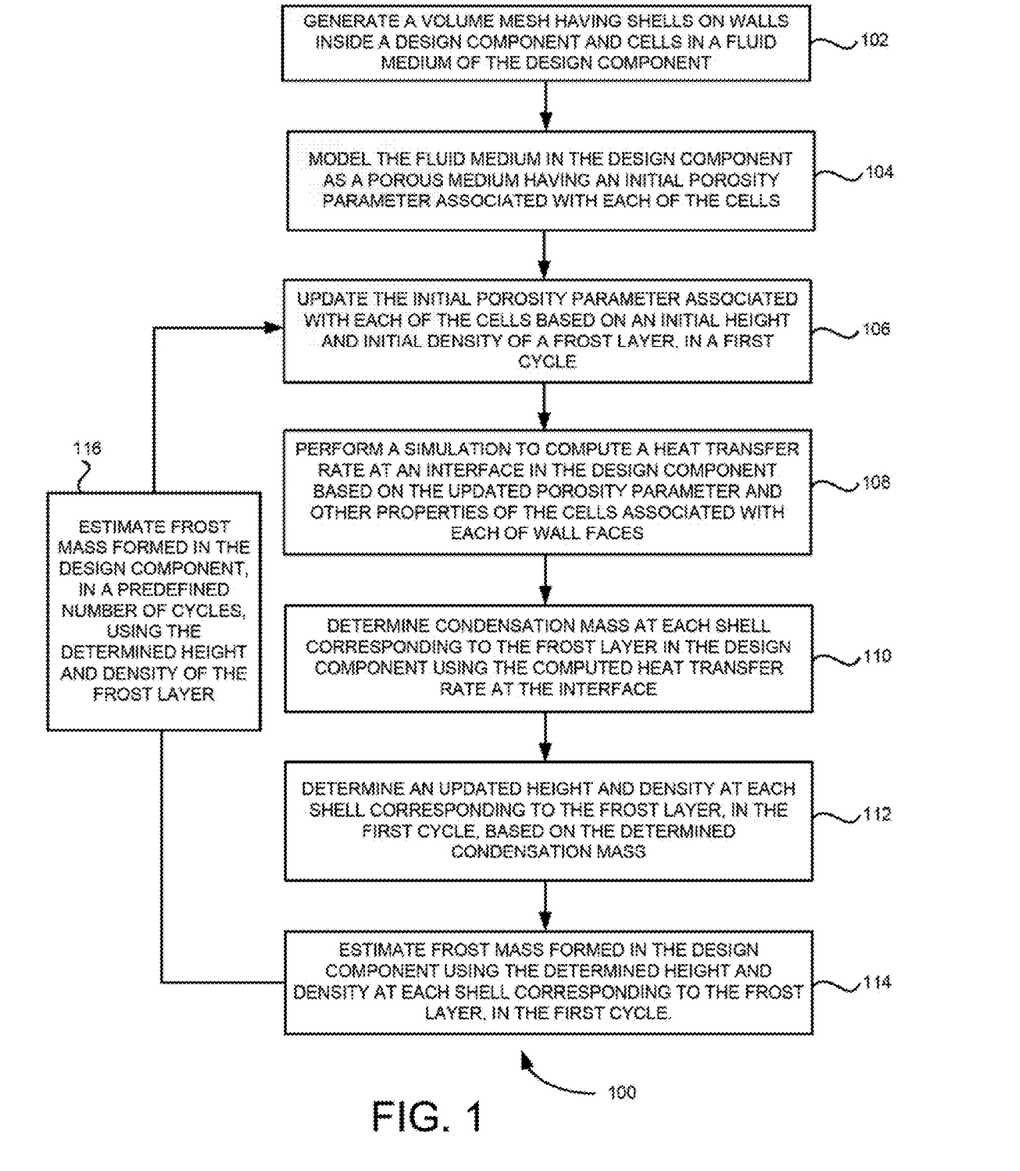
FIG. 1 is a flow diagram depicting a method for estimating frost mass formed in a design component of a multi-component structure, according to one embodiment.

FIG. 1 is a flow diagram 100 depicting a method for estimating frost mass formed in a design component of a multi-component structure, according to one embodiment. For example, the multi-component structure includes a vehicle (e.g., an aircraft, an automobile and the like), an air conditioning system and the like. The design component may include ducts or bends with uniform or non-uniform cross-sectional areas in a cold environment. At block 102, a volume mesh of the design component is generated. The volume mesh may include cells of various shapes, such as tetrahedral, hexahedral, polyhedral and the like in the volume or the fluid medium of the design component and shells at boundaries, walls, interfaces inside the design component. At block 104, the fluid medium in the design component is modeled as a porous medium having an initial porosity parameter associated with each of the cells of the fluid medium. For example, the initial porosity parameter associated with each of the cells is 1.0 (i.e., there is no solid region or medium). For example, the fluid medium is modeled as the porous medium based on viscous loss, inertial loss, and pressure loss in fluid flow of the design component. In this example, boundary conditions, such as wall surface temperatures, flow inlets (e.g., flow rates (air velocities), temperatures and humidity levels, directions of flow, turbulence boundary conditions of flow at inlet and the like) and the like are also considered while modelling the fluid medium as the porous medium.

At block 106, the initial porosity parameter associated with each of the cells is updated based on an initial height and initial density at each shell corresponding to a frost layer, in a first cycle. For example, the initial height and the initial density of the frost layer are guessed or assumed height and density of the frost layer when the frost mass estimation process is started. The first cycle can be a first cycle after the frost mass estimation process is started. In an embodiment, cells for each wall face (i.e., shells) in the design component are selected using semi hemispheres having a diameter equal to the initial height of the frost layer. Further, the porosity parameter associated with each of the selected cells is updated based on the initial density of the frost layer at each wall face (shells). For example, a porosity value at a normal fluid region is 1.0 and in regions of a domain near a cold wall or surface where the frost exists, porosity values are varied (i.e., in between 0 to 1) to incorporate frost modelling in the fluid medium. In an example, a porosity value of 0.4 at a cell indicates 40% of solid medium is present at the cell which is partially blocking the fluid.

Figure 2A:
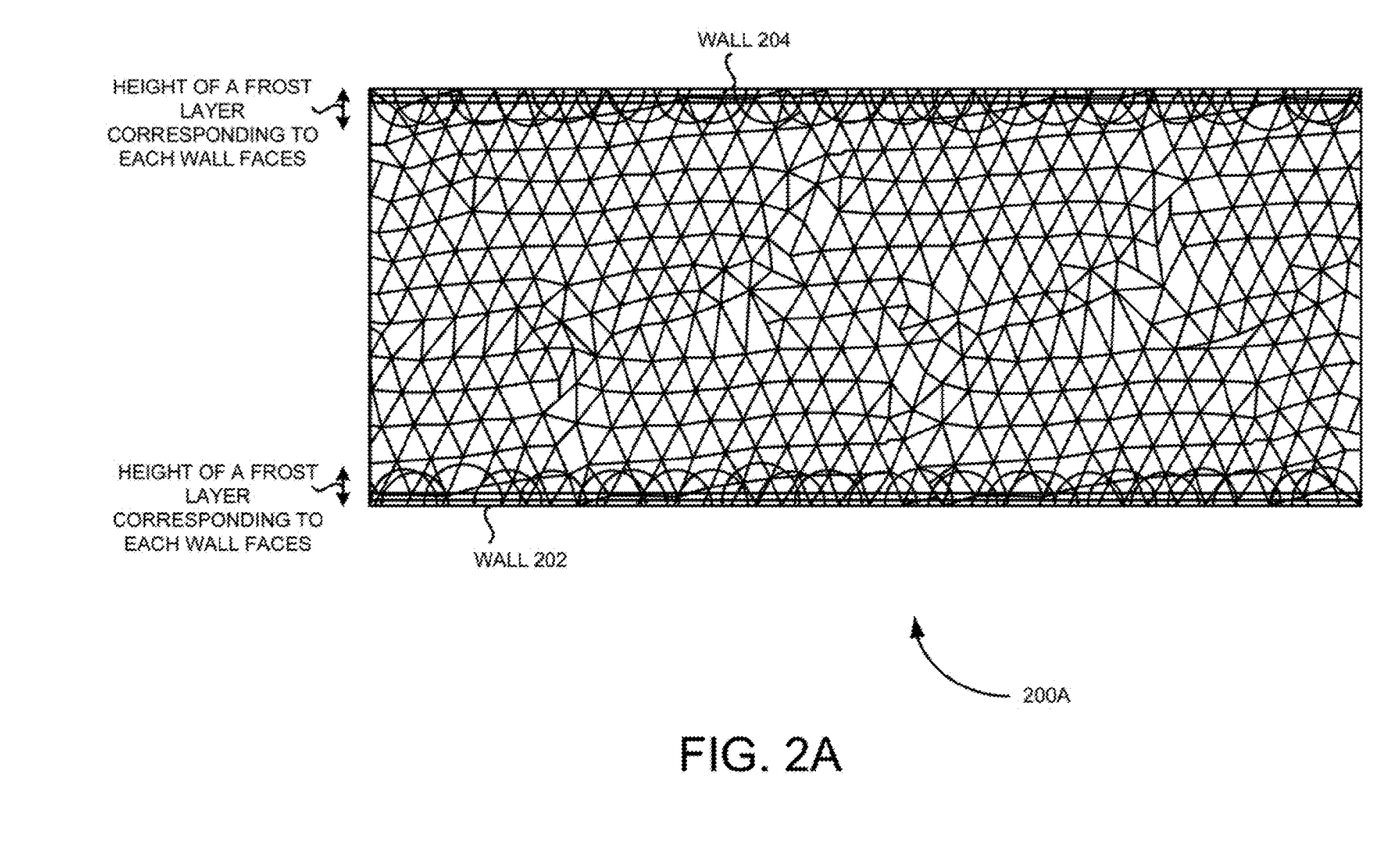
FIG. 2A is a schematic diagram depicting selection of cells for modeling a frost layer in a design component, according to one embodiment.
Figure 2B:
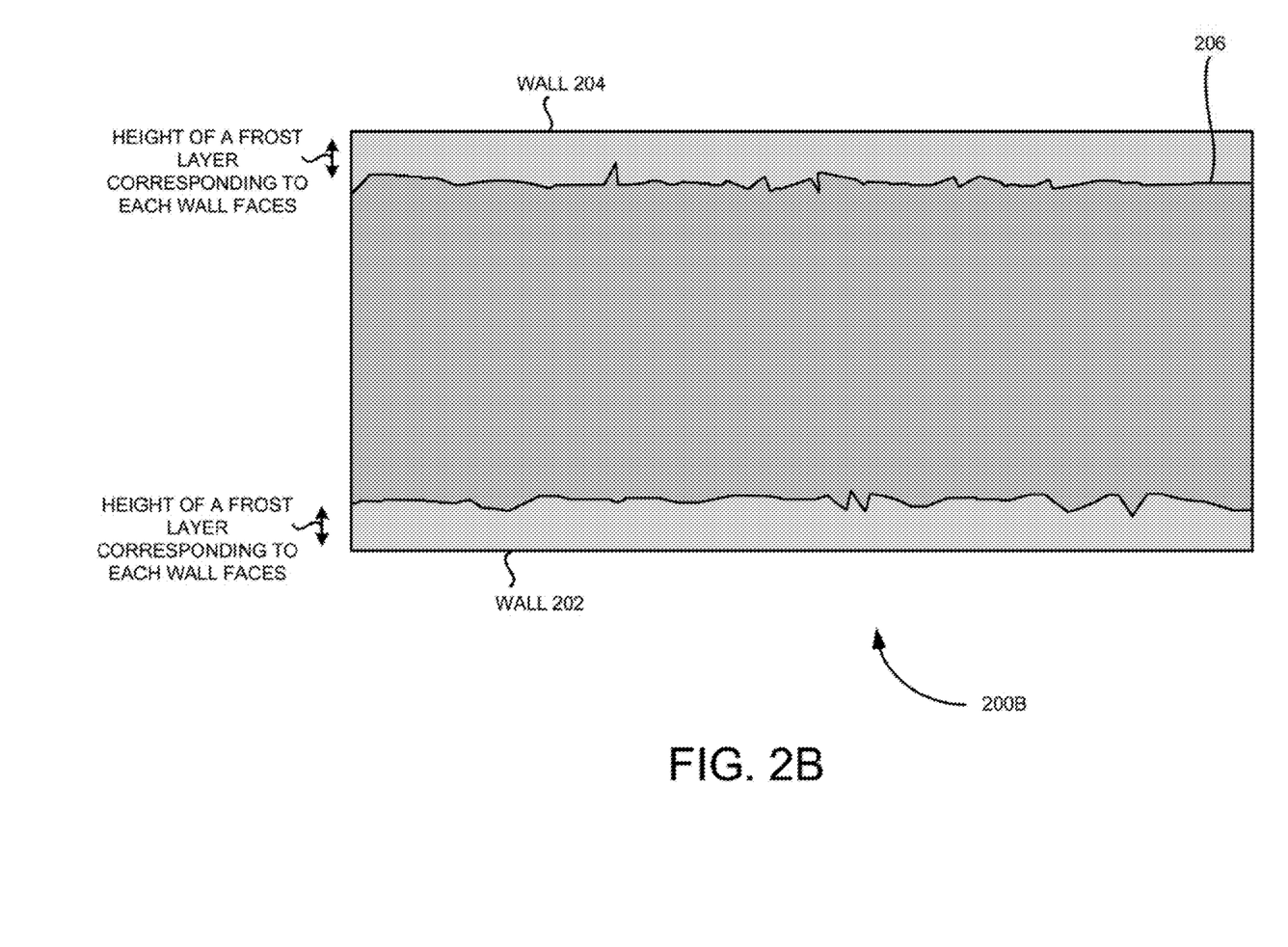
FIG. 2B is a schematic diagram depicting a height at each shell corresponding to the frost layer after performing simulation, according to one embodiment.

As shown in a schematic diagram 200A of FIG. 2A, a plurality of semi hemispheres are drawn from each wall face which represent a local frost height. The diameter of each semi hemisphere represents the local frost height that belongs to each wall face of cold walls 202 and 204 of the design component. This way of selection of cells within hemisphere may a) ensure growth of the frost layer in a smooth manner rather than having sudden peaks which in turn can affect the convergence of solution, b) remove possibility of having isolated porous cells in the domain which can deteriorate a flow solution and c) result in smooth interface between the fluid medium and the frost layer. A schematic diagram 200B of FIG. 2B represents presence of the frost layer and a height of the frost layer after performing computational fluid dynamics (CFD) simulation on the FIG. 2A. As shown in FIG. 2B, an interface 206 is rather smooth and no isolated cells are found inside the flow domain.

At block 108, a CFD simulation is performed to compute a heat transfer rate at the interface in the design component based on the updated or initial porosity parameter and/or other properties of the cells associated with each of the wall faces (shells). The heat transfer rate computation in the fluid domain is performed by a CFD tool. In an embodiment, heat transfer through the porous medium can be represented with or without assumption of thermal equilibrium between the porous medium and the fluid flow. In this embodiment, the porous medium is assumed as isotropic and an effective conductivity is estimated by using the porosity parameter which is a weighted average of fluid and solid regions as shown below.

$$(\rho C_p)_{pm}\left(\frac{\partial T_{pm}}{\partial t} + U \cdot \nabla T_{pm}\right) = \nabla \cdot (k_{eff} \nabla T_{pm})$$

wherein,
$\rho$=a density,
$C_p$=a specific capacity of the fluid,
$U$=a flow field convention,
$T_{pm}$=a temperature, and
$K_{eff}$=an effective thermal conductivity.

Further, the effective thermal conductivity in the porous medium, $k_{eff}$, is computed as a volume average of a fluid medium thermal conductivity and a solid medium thermal conductivity using a below example equation:

$$k_{eff} = k_f \gamma + k_s (1-\gamma)$$

wherein,
$k_f$=a fluid medium thermal conductivity,
$k_s$=a solid medium thermal conductivity, and
$\gamma$=a porosity parameter of the medium.

Furthermore, a product of the density and the specific capacity of the fluid in the porous medium is obtained using a below example equation:

$$(\rho C_p)_{pm} = (\rho C_p)_s (1-\gamma) + (\rho C_p)_f \gamma$$

wherein,
$(\rho C_p)_s$=a product of the density and the specific capacity of the fluid in the solid medium, and
$(\rho C_p)_f$=a product of the density and the specific capacity of the fluid in the fluid medium.

At block 110, condensation mass at each of the shells corresponding to the frost layer in the design component is determined using the computed heat transfer rate at the interface. In an example implementation, a condensation rate at each shell corresponding to the frost layer is determined using the determined heat transfer rate at the interface and then the condensation mass at each shell corresponding to the frost layer is determined using the condensation rate. In this example implementation, the condensation rate is governed by a rate of diffusion of water vapour towards a cold wall of the design component. For example, the condensation mass can be represented through use of a mass (continuity) source term in a near-cell wall as shown in below equation:

$$\dot{m}''' = \rho v \frac{A_{cell\ wall}}{V_{cell}} \qquad (1)$$

wherein,
$\dot{m}'''$=a total condensation rate per unit volume at a wall face,

ρ=a density of fluid adjacent to the wall,
v=a velocity of the fluid,
$A_{cellwall}$=an area of the wall face, and
$V_{cell}$=a volume of a cell.

At block 112, an updated height and density at each shell corresponding to the frost layer, in the first cycle, are determined based on the determined condensation mass. In an example implementation, a change in the initial height and initial density at each shell corresponding to the frost layer is determined based on the determined condensation mass. This is explained in more detail with reference to FIG. 3. Further in this example implementation, the updated height and density at each shell corresponding to the frost layer, in the first cycle, are determined by adding the computed change to the initial height and initial density of the frost layer, respectively.

After each iteration, the frost interface is calculated in the fluid medium based on the porosity parameters of the cells. Once the frost interface is calculated, the frost mass estimations are performed where the heat transfer rate on the frost interface is accessed from the CFD tool. Once the frost mass at all shells on the frost interface are estimated, this data is transferred to the respective wall faces (shells) where these values are used to update the frost height and frost density and hence the other parameters like frost density and calculation of hemisphere radius for application of porosity in updated frost layer cells. Porosity at normal fluid region is 1.0 and the regions of domain near the wall where frost exists, the porosity value is varied as per frost modeling.

At block 114, frost mass formed in the design component is estimated using the determined height and density at each shell corresponding to the frost layer, in the first cycle. At block 116, the process steps from block 106 to block 114 are repeated for estimating frost mass formed in the design component for a predefined number of cycles. If the frost mass is estimated during a design phase or manufacturing of the structure, then design of the structure is changed such that the frost formation is reduced. If the frost mass is estimated after design and before use of the structure (i.e., before flight in case of an aircraft), then the structure is sent for maintenance (i.e., cleaning) or a ventilation system is changed to maintain efficiency of the structure.

Figure 3:
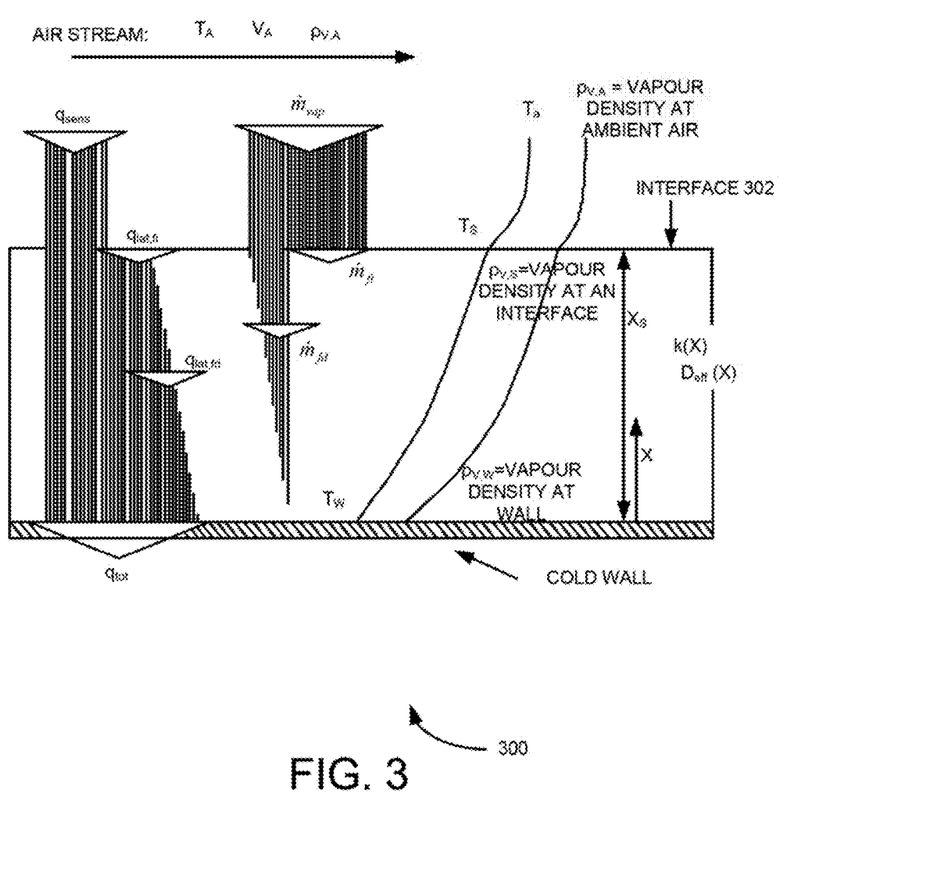
FIG. 3 is a schematic diagram depicting splitting of condensation mass at each shell corresponding to a frost layer in a design component as a height and density of the frost layer, according to one embodiment.

Referring now to FIG. 3, which is a schematic diagram 300 depicting splitting of condensation mass at each shell corresponding to a frost layer in a design component as a height and density of the frost layer, according to one embodiment. As shown in FIG. 3, the condensed mass ($\dot{m}'''$), shown in equation (1), at an interface 302 is divided into two parts. One part ($\dot{m}_{fd}$) of the condensation mass enters inside the porous frost layer and increases the density of the frost layer. The other part ($\dot{m}_{fi}$) of the condensed mass accumulates at the interface and increases the height of the frost layer. The condensation mass ($\dot{m}'''$) is divided into $\dot{m}_{fd}$ and $\dot{m}_{fi}$ as shown in a below example equation:

$$\dot{m}''' = \dot{m}_{vap} = \dot{m}_{fd} + \dot{m}_{fi} = \frac{\partial \rho_f}{\partial t} X_s + \frac{\partial X_s}{\partial t} \rho_i$$

$$\dot{m}_{fd} = F_{vap} \cdot \left[\frac{\partial T}{\partial X}\right]_{X=X_x}$$

$$F_{vap} = \frac{D_{eff} M_V}{R T_S} \left[\left[\frac{\partial P_V}{\partial T}\right]_{X=X_x} - \frac{P_V(T_S)}{T_S}\right]$$

$$\left[\frac{\partial T}{\partial X}\right]_{X=X_s} = \frac{h_H(T_A - T_S) + H_S \dot{m}_{vap}}{k_f + H_S F_{vap}} = \frac{q_{tot}}{k_f + H_S F_{vap}}$$

-continued $$k_f = 1.202 \cdot 10^{-3} \rho_f^{0.963}$$

$$D_{eff} = \frac{(1 - (\rho_f / \rho_{ice}))}{(1 + (\rho_f / \rho_{ice})^{0.5})} D_S \text{ or } D_{eff} = \frac{(1 - (\rho_f / \rho_{ice}))}{(1 - 0.58 \cdot (\rho_f / \rho_{ice}))} D_S$$

wherein,
$\rho_f$=a density of the frost layer,
$\rho_{ice}$=a density of ice or a solid medium,
$X_s$=a height of the frost layer,
$k_f$=a thermal conductivity or frost conductivity,
$F_{vap}$=a frost densification factor,
$D_{eff}$=a molecular diffusivity,
$T_S$=a temperature at the interface,
R=a universal gas constant,
$M_v$=molecular mass,
$P_v$=a vaporization pressure,
$H_S$=Heat of sublimation,
$T_a$=an atmospheric temperature,
$h_H$=a heat transfer co-efficient, and
$q_{tot}$=total heat.

Further, changes in the density and height of the frost layer are obtained using below equations, respectively:

$$\Delta \rho_f = \frac{\dot{m}_{fd}}{X_S} \Delta t$$

$$\Delta X_S = \frac{(\dot{m}_{vap} - \dot{m}_{fd})}{\rho_f} \Delta t$$

Figure 4:
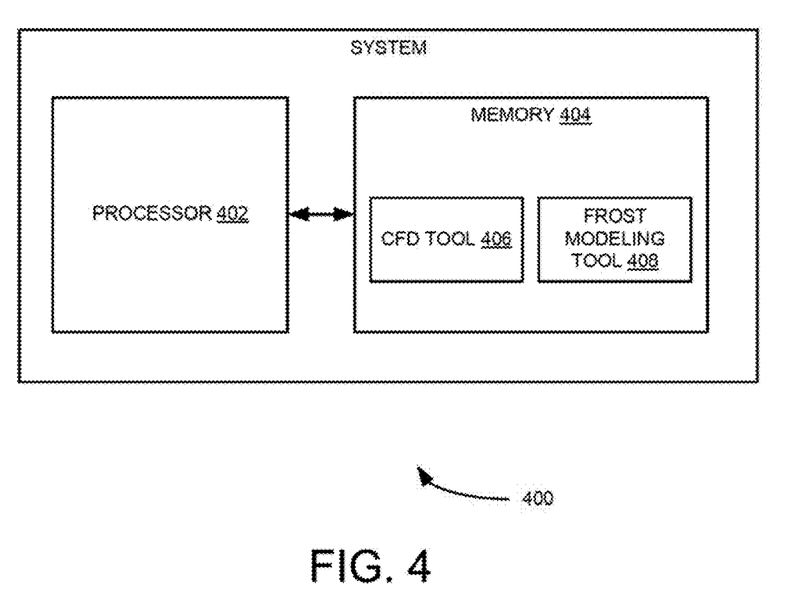
FIG. 4 is a block diagram depicting a system for estimating frost mass formed in a design component of a multi-component structure, using the process described with reference to FIG. 1, according to one embodiment.

Referring now to FIG. 4, which is a block diagram depicting a system 400 for estimating frost mass formed in a design component of a multi-component structure, using the process described with reference to FIG. 1, according to one embodiment. As shown in FIG. 4, the system 400 includes a processor 402 and a memory 404 communicatively coupled to the processor 402. Further, the memory 404 includes a CFD tool 406 and a frost modeling tool 408. In some embodiments, the frost modeling tool 408 can reside inside the CFD tool 406 using a user defined module.

In one embodiment, the CFD tool 406 generates a volume mesh having shells on walls inside the design component and cells in the fluid medium of the design component. Further, the CFD tool 406 models the fluid medium in the design component as a porous medium having an initial porosity parameter associated with each of the cells. Furthermore, the CFD tool 406 updates the initial porosity parameter associated with each of the cells based on an initial height and initial density of the frost layer, in a first cycle. In addition, the CFD tool 406 performs a simulation to compute a heat transfer rate at an interface between the fluid medium and the frost layer in the design component based on the updated initial porosity parameter associated with each of the cells.

The frost modeling tool 408 then determines condensation mass at each shell corresponding to the frost layer using the computed heat transfer rate at the interface. Further, the frost modeling tool 408 determines an updated height and density at each shell corresponding to the frost layer, in the first cycle, based on the determined condensation mass. Furthermore, the frost modeling tool 408 estimates frost mass formed in the design component using the determined height and density at each shell corresponding to the frost layer, in the first cycle.

Moreover, the CFD tool 406 repeats the steps of updating the porosity parameter associated with each of the cells based on the determined height and density at each shell corresponding to the frost layer and performing a simulation to compute a heat transfer rate at the interface in a next cycle. Also, the frost modeling tool repeats the steps of determining condensation mass at each shell corresponding to the frost layer, determining an updated height and density at each shell corresponding to the frost layer and estimating frost mass formed in the design component based on the determined height and density at each shell corresponding to the frost layer in the next cycle. This is explained in more detail with reference to FIG. 1.

Figure 5:
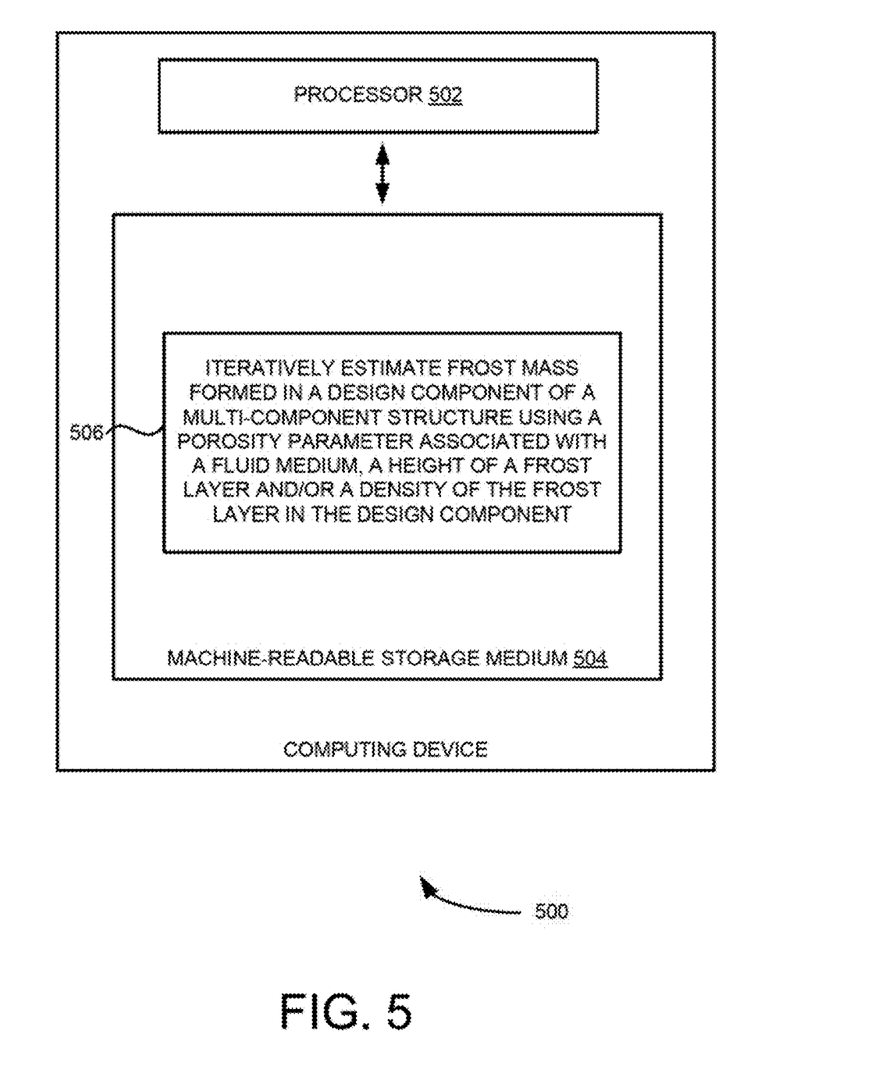
FIG. 5 is a block diagram depicting a computing device for estimating frost mass formed in a design component of a multi-component structure, using the process described with reference to FIG. 1, according to one embodiment.

FIG. 5 is a block diagram depicting a computing device 500 for estimating frost mass formed in a design component of a multi-component structure, using the process described with reference to FIG. 1, according to one embodiment. The computing device 500 includes a processor 502 and a machine-readable storage medium 504 communicatively coupled through a system bus. The processor 502 may be any type of central processing unit (CPU), microprocessor, or processing logic that interprets and executes machine-readable instructions stored in the machine-readable storage medium 504. The machine-readable storage medium 504 may be a random access memory (RAM) or another type of dynamic storage device that may store information and machine-readable instructions that may be executed by the processor 502. For example, the machine-readable storage medium 504 may be synchronous DRAM (SDRAM), double data rate (DDR), rambus DRAM (RDRAM), rambus RAM, etc., or storage memory media such as a floppy disk, a hard disk, a CD-ROM, a DVD, a pen drive, and the like. In an example, the machine-readable storage medium 504 may be a non-transitory machine-readable storage medium. In an example, the machine-readable storage medium 504 may be remote but accessible to the computing device 500.

The machine-readable storage medium 504 may store instruction 506. In an example, instruction 506 may be executed by processor 502 to iteratively estimate the frost mass formed in the design component using a porosity parameter associated with a fluid medium, a height of a frost layer and/or a density of the frost layer in the design component.

For the purpose of simplicity of explanation, the example method of FIG. 1 is shown as executing serially, however it is to be understood and appreciated that the present and other examples are not limited by the illustrated order. The example systems of FIGS. 4 and 5, and method of FIG. 1 may be implemented in the form of a computer program product including computer-executable instructions, such as program code, which may be run on any suitable computing device in conjunction with a suitable OS. Examples within the scope of the present disclosure may also include program products comprising non-transitory computer-readable storage media for carrying or having computer-executable instructions or data structures stored thereon. Such computer-readable media can be any available media that can be accessed by a general purpose or special purpose computer. By way of example, such computer-readable media can comprise RAM, ROM, EPROM, EEPROM, CD-ROM, magnetic disk storage or other storage devices, or any other medium which can be used to carry or store desired program code in the form of computer-executable instructions and which can be accessed by a general purpose or special purpose computer. The computer readable instructions can also be accessed from memory and executed by a processor.

Although certain methods, systems, apparatus, and articles of manufacture have been described herein, the scope of coverage of this patent is not limited thereto. To the contrary, this patent covers all methods, apparatus, and articles of manufacture fairly falling within the scope of the appended claims either literally or under the doctrine of equivalents.

What is claimed is:

1. A method comprising:
iteratively estimating the frost mass formed in the design component using a porosity parameter associated with a fluid medium, a height of a frost layer and/or a density of the frost layer in the design component, wherein iteratively estimating the frost mass formed in the design component comprises:
generating a volume mesh having shells on walls inside the design component and cells in the fluid medium of the design component;
modeling the fluid medium in the design component as a porous medium having an initial porosity parameter associated with each of the cells, wherein the initial porosity parameter associated with each of the cells comprises a porosity value having a weighted average of fluid and solid regions associated with each of the cells;
updating the initial porosity parameter associated with each of the cells based on an initial height and initial density of the frost layer, in a first cycle;
performing a simulation to compute a heat transfer rate at an interface between the fluid medium and the frost layer in the design component based on the updated initial porosity parameter associated with each of the cells;
determining condensation mass at each shell corresponding to the frost layer using the computed heat transfer rate at the interface;
determining an updated height and density at each shell corresponding to the frost layer, in the first cycle, based on the determined condensation mass;
estimating frost mass formed in the design component using the determined height and density at each shell corresponding to the frost layer, in the first cycle;
designing the component to reduce the frost mass formation or removing the frost mass formed on the designed component based on the estimated frost mass; and
manufacturing the design component in accordance with the designing of the component.

2. The method of claim 1, further comprising:
repeating the steps of updating the porosity parameter associated with each of the cells, performing a simulation to compute a heat transfer rate at the interface, determining condensation mass at each shell corresponding to the frost layer, determining an updated height and density at each shell corresponding to the frost layer, and estimating frost mass formed in the design component based on the determined height and density at each shell corresponding to the frost layer fora predefined number of cycles.

3. The method of claim 1, wherein determining the updated height and density at each shell corresponding to the frost layer, in the first cycle, based on the determined condensation mass, comprises:
computing a change in the initial height and initial density at each shell corresponding to the frost layer based on the determined condensation mass; and
determining the updated height and density at each shell corresponding to the frost layer, in the first cycle, by adding the computed change to the initial height and initial density of the frost layer, respectively.

4. The method of claim 1, wherein the multi-component structure comprises a vehicle or an air conditioning system and wherein the design component comprises ducts or bends having uniform or non-uniform cross-sectional areas.

5. A method comprising:
iteratively estimating the frost mass formed in the design component using a porosity parameter associated with a fluid medium, a height of a frost layer and/or a density of the frost layer in the design component, wherein iteratively estimating the frost mass formed in the design component comprises:
generating a volume mesh having shells on walls inside the design component and cells in the fluid medium of the design component;
modeling the fluid medium in the design component as a porous medium having an initial porosity parameter associated with each of the cells;
updating the initial porosity parameter associated with each of the cells based on an initial height and initial density of the frost layer, in a first cycle, wherein the updating comprises:
selecting at least one of the cells for each wall face in the design component using semi hemispheres having a diameter equal to the initial height of the frost layer; and
updating the initial porosity parameter associated with each of the selected one of the cells based on the initial density of the frost layer;
performing a simulation to compute a heat transfer rate at an interface between the fluid medium and the frost layer in the design component based on the updated initial porosity parameter associated with each of the cells;
determining condensation mass at each shell corresponding to the frost layer using the computed heat transfer rate at the interface;
determining an updated height and density at each shell corresponding to the frost layer, in the first cycle, based on the determined condensation mass;
estimating frost mass formed in the design component using the determined height and density at each shell corresponding to the frost layer, in the first cycle;
designing the component to reduce the frost mass formation or removing the frost mass formed on the designed component based on the estimated frost mass; and
manufacturing the design component in accordance with the designing of the component.

6. A system comprising:
a processor; and
a memory coupled to the processor, wherein the memory comprises:
a frost modeling tool, wherein the frost modeling tool iteratively estimates frost mass formed in a design component of a multi-component structure using a porosity parameter associated with a fluid medium, a height of a frost layer and/or a density of the frost layer in the design component; and
a computational fluid dynamics (CFD) tool, wherein the CFD tool is configured to:
generate a volume mesh having shells on walls inside the design component and cells in the fluid medium of the design component;
model the fluid medium in the design component as a porous medium having an initial porosity parameter associated with each of the cells, wherein the initial porosity parameter associated with each of the cells comprises a porosity value which is a weighted average of fluid and solid regions associated with each of the cells;
update the initial porosity parameter associated with each of the cells based on an initial height and initial density of the frost layer, in a first cycle;
perform a simulation to compute a heat transfer rate at an interface between the fluid medium and the frost layer in the design component based on the updated initial porosity parameter associated with each of the cells;
determine condensation mass at each shell corresponding to the frost layer using the computed heat transfer rate at the interface;
determine an updated height and density at each shell corresponding to the frost layer, in the first cycle, based on the determined condensation mass;
estimate frost mass formed in the design component using the determined height and density at each shell corresponding to the frost layer, in the first cycle, wherein the component is designed to reduce the frost mass formed or removing the frost mass formed on the designed component based on the estimated frost mass; and
manufacturing the design component in accordance with the designing of the component.

7. The system of claim 6, wherein the CFD tool is further configured to:
repeat the steps of updating the porosity parameter associated with each of the cells based on the determined height and density at each shell corresponding to the frost layer and performing a simulation to compute a heat transfer rate at the interface in a next cycle.

8. The system of claim 7, wherein the frost modeling tool is further configured to:
repeat the steps of determining condensation mass at each shell corresponding to the frost layer, determining an updated height and density at each shell corresponding to the frost layer and estimating frost mass formed in the design component based on the determined height and density at each shell corresponding to the frost layer in the next cycle.

9. The system of claim 6, wherein the frost modeling tool is configured to:
compute a change in the initial height and initial density at each shell corresponding to the frost layer based on the determined condensation mass; and
determine the updated height and density at each shell corresponding to the frost layer, in the first cycle, by adding the computed change to the initial height and initial density of the frost layer, respectively.

10. The system of claim 6, wherein the multi-component structure comprises a vehicle or an air conditioning system and wherein the design component comprises ducts or bends having uniform or non-uniform cross-sectional areas.

11. A system comprising:
a processor; and
a memory coupled to the processor, wherein the memory comprises:
a frost modeling tool, wherein the frost modeling tool iteratively estimates frost mass formed in a design component of a multi-component structure using a porosity parameter associated with a fluid medium, a height of a frost layer and/or a density of the frost layer in the design component; and a computational fluid dynamics (CFD) tool, wherein the CFD tool is configured to:
generate a volume mesh having shells on walls inside the design component and cells in the fluid medium of the design component;
model the fluid medium in the design component as a porous medium having an initial porosity parameter associated with each of the cells;
update the initial porosity parameter associated with each of the cells based on an initial height and initial density of the frost layer, in a first cycle, wherein the CFD tool is configured to:
select at least one of the cells for each wall face in the design component using semi hemispheres having a diameter equal to the initial height of the frost layer; and
update the initial porosity parameter associated with each of the selected one of the cells based on the initial density of the frost layer; and
perform a simulation to compute a heat transfer rate at an interface between the fluid medium and the frost layer in the design component based on the updated initial porosity parameter associated with each of the cells, wherein the component is designed to reduce the frost mass formed or removing the frost mass formed on the designed component based on the simulation;
manufacturing the design component in accordance with the designing of the component.

12. A non-transitory computer-readable storage medium including instructions executable by a processor to:
iteratively estimate frost mass formed in a design component of a multi-component structure using a porosity parameter associated with a fluid medium, a height of a frost layer and/or a density of the frost layer in the design component, wherein iteratively estimating the frost mass formed in the design component comprises:
generating a volume mesh having shells on walls inside the design component and cells in the fluid medium of the design component;
modeling the fluid medium in the design component as a porous medium having an initial porosity parameter associated with each of the cells, wherein the initial porosity parameter associated with each of the cells comprises a porosity value having a weighted average of fluid and solid regions associated with each of the cells;
updating the initial porosity parameter associated with each of the cells based on an initial height and initial density of the frost layer, in a first cycle;
performing a simulation to compute a heat transfer rate at an interface between the fluid medium and the frost layer in the design component based on the updated initial porosity parameter associated with each of the cells;
determining condensation mass at each shell corresponding to the frost layer using the computed heat transfer rate at the interface;
determining an updated height and density at each shell corresponding to the frost layer, in the first cycle, based on the determined condensation mass;
estimating frost mass formed in the design component using the determined height and density at each shell corresponding to the frost layer, in the first cycle;

designing the component to reduce the frost mass formation or removing the frost mass formed on the designed component based on the estimated frost mass;
manufacturing the design component in accordance with the designing of the component.

13. The non-transitory computer-readable storage medium of claim 12, further comprising:
repeating the steps of updating the porosity parameter associated with each of the cells, performing a simulation to compute a heat transfer rate at the interface, determining condensation mass at each shell corresponding to the frost layer, determining an updated height and density at each shell corresponding to the frost layer, and estimating frost mass formed in the design component based on the determined height and density at each shell corresponding to the frost layer fora predefined number of cycles.

14. The non-transitory computer-readable storage medium of claim 12, wherein determining the updated height and density at each shell corresponding to the frost layer, in the first cycle, based on the determined condensation mass, comprises:
computing a change in the initial height and initial density at each shell corresponding to the frost layer based on the determined condensation mass; and
determining the updated height and density at each shell corresponding to the frost layer, in the first cycle, by adding the computed change to the initial height and initial density of the frost layer, respectively.

15. The non-transitory computer-readable storage medium of claim 12, wherein the multi-component structure comprises a vehicle or an air conditioning system and wherein the design component comprises ducts or bends having uniform or non-uniform cross-sectional areas.

16. A non-transitory computer-readable storage medium including instructions executable by a processor to:
iteratively estimate frost mass formed in a design component of a multi-component structure using a porosity parameter associated with a fluid medium, a height of a frost layer and/or a density of the frost layer in the design component, wherein iteratively estimating the frost mass formed in the design component comprises:
generating a volume mesh having shells on walls inside the design component and cells in the fluid medium of the design component;
modeling the fluid medium in the design component as a porous medium having an initial porosity parameter associated with each of the cells;
updating the initial porosity parameter associated with each of the cells based on an initial height and initial density of the frost layer, in a first cycle, wherein the updating comprises:
selecting at least one of the cells for each wall face in the design component using semi hemispheres having a diameter equal to the initial height of the frost layer; and
updating the initial porosity parameter associated with each of the selected one of the cells based on the initial density of the frost layer;
performing a simulation to compute a heat transfer rate at an interface between the fluid medium and the frost layer in the design component based on the updated initial porosity parameter associated with each of the cells;

determining condensation mass at each shell corresponding to the frost layer using the computed heat transfer rate at the interface;

determining an updated height and density at each shell corresponding to the frost layer, in the first cycle, based on the determined condensation mass;

estimating frost mass formed in the design component using the determined height and density at each shell corresponding to the frost layer, in the first cycle;

designing the component to reduce the frost mass formation or removing the frost mass formed on the designed component based on the estimated frost mass; and manufacturing the design component in accordance with the designing of the component.

* * * * *